United States Patent
Yung

(10) Patent No.: US 6,307,266 B1
(45) Date of Patent: Oct. 23, 2001

(54) METAL-LINE STRUCTURE HAVING A SPACER STRUCTURE COVERING THE SIDEWALLS THEREOF

(75) Inventor: Hao-Chieh Yung, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/619,970

(22) Filed: Jul. 20, 2000

Related U.S. Application Data

(62) Division of application No. 09/164,814, filed on Oct. 1, 1998, now Pat. No. 6,127,252.

(30) Foreign Application Priority Data

May 26, 1998 (TW) .............................................. 87108188 A

(51) Int. Cl.$^7$ ................................................. H01L 29/40
(52) U.S. Cl. ........................ 257/758; 257/751; 257/763; 257/764; 257/767; 257/768; 257/770
(58) Field of Search .................................. 257/750, 751, 257/758, 763, 764, 767, 768, 770; 438/636

(56) References Cited

U.S. PATENT DOCUMENTS

| | | | | |
|---|---|---|---|---|
| 4,810,332 | * | 3/1989 | Pan ......................................... | 205/125 |
| 6,030,896 | * | 2/2000 | Brown ..................................... | 438/687 |
| 6,060,382 | * | 9/2000 | Lee ......................................... | 438/622 |
| 6,074,943 | * | 6/2000 | Brennan et al. ........................ | 438/636 |
| 6,130,154 | * | 10/2000 | Yokoyama et al. .................... | 438/627 |
| 6,133,619 | * | 10/2000 | Sahota et al. .......................... | 257/649 |
| 6,140,238 | * | 10/2000 | Kitch ..................................... | 438/687 |

\* cited by examiner

Primary Examiner—Carl Whitehead, Jr.
Assistant Examiner—Toniae M. Thomas
(74) Attorney, Agent, or Firm—Jiawei Huang; J. C. Patents

(57) ABSTRACT

A metal-line structure in an integrated circuit (IC) and a method of fabricating the same are provided. The metal-line structure includes a barrier layer formed at a selected location over the dielectric layer, a metallization layer formed over the barrier layer, an ARC formed over the metallization layer, and a spacer structure formed over all the exposed sidewalls of the barrier layer, the metallization layer, and the ARC. The forming of the spacer structure on each of the metal lines can help prevent the occurrence of extrusions along the sidewalls of the metal lines in the IC device that would otherwise cause dielectric cracks and thus lead to undesired bridging between neighboring metal lines as in the prior art. Moreover, the method of fabricating such a metal-line structure can be carried out without having to perform photolithography, thus reducing manufacturing cost.

6 Claims, 5 Drawing Sheets

METAL-LINE STRUCTURE HAVING A SPACER STRUCTURE COVERING THE SIDEWALLS THEREOF

CROSS-REFERENCE TO RELATED APPLICATION

This application is a divisional application of, and claims the priority benefit of, U.S. application Ser. No. 09/164,814 filed on Oct. 1, 1998 now U.S. Pat. No. 6,127,252.

BACKGROUND OF THE INVENTION

1. Field of the Invention

This invention relates to semiconductor fabrication technologies, and more particularly, to a metal-line structure in an integrated circuit (IC) and a method of fabricating the same, which can help prevent the occurrence of extrusions along the sidewalls of the respective metal lines.

2. Description of Related Art

In VLSI (very large-scale integration) semiconductor devices, MOS (metal-oxide semiconductor) transistors are interconnected with each other and various other devices via a plurality of conductive layers called metal lines. These metal lines should be adequately isolated from each other so as to prevent short-circuits therebetween. As the level of integration rises, the isolation between the metal lines becomes very critical since these metal lines are made smaller and closer to each other. Therefore, any cracks in the dielectric layers used to isolate the metal lines from each other can cause bridging between neighboring metal lines. A conventional metal-line structure is illustratively depicted in the following with reference to FIGS. 1A–1D.

FIG. 1A shows a metal-line structure constructed on a semiconductor substrate 10, which is already formed with a plurality of MOS transistors (not shown) thereon. Next, a dielectric layer 12 is formed over the substrate 10. After this, a barrier layer 14 is formed over the dielectric layer 12 prior to the forming of a metallization layer 16. This barrier layer 14 can be formed from titanium nitride (TiN), titanium (Ti), tungsten nitride (WN), or the alloy of titanium and tungsten (Ti/W). This barrier layer 14 serves to prevent the occurrence of spiking between the metallization layer 16 and the substrate 10.

The metallization layer 16 is preferably formed from aluminum. Since the metallization layer 16 has a high reflectivity to light, which can adversely affect the definition of the pattern transfer in the subsequent photolithographic process, an ARC (anti-reflective coating) 18 is coated over the entire top surface of the metallization layer 16 to eliminate this problem. The ARC 18 can be formed from any non-reflective material, but is preferably made from the same material used to form the barrier layer 14 so that the process can be carried out in a more cost-effective way.

In this case, the barrier layer 14, the metallization layer 16, and the ARC 18 in combination are customarily referred to as a sandwich structure (from the fact that the metallization layer 16 is sandwiched by two layers of the same material).

As FIG. 1B illustrates, a plurality of photoresist layers 30 are then formed at selected locations over the wafer through a photolithographic and etching process. More specifically, these photoresist layers 30 are formed at those locations where a plurality of metal lines for the IC device are to be formed.

FIG. 1C further illustrates the subsequent step, in which an anisotropic dry etching process is performed on the wafer with the photoresist layers 30 serving as mask until the top surface of the dielectric layer 12 is exposed. Through this process, those parts of the ARC 18, the metallization layer 16, and the barrier layer 14 that are not covered by the photoresist layers 30 are entirely removed (the remaining parts thereof are herein and hereinafter designated instead by the reference numerals 18a, 16a, 14a for distinguishing purpose).

FIG. 1D shows the subsequent step, in which the photoresist layers 30 are entirely removed. After this, the combination of each metallization layer 16a, the underlying barrier layer 14a, and the overlying ARC 18a constitute one metal line (as collectively designated by the reference numeral 32). This concludes the fabrication of the metal-line structure over the dielectric layer 12.

In the case of FIG. 1D, for example, two metal lines are illustrated for the purpose of demonstration. This metal-line structure serves as metal interconnects in the IC device. Customarily, a second dielectric layer called a passivation layer (not shown) will be formed over the metal-line structure for the purpose of protecting the metal-line structure against corrosion and metal shortage. All the subsequent steps to complete the fabrication of the IC device are conventional processes and not within the spirit and scope of the invention, so description thereof will not be further detailed.

In the foregoing metal-line structure, the forming of the barrier layer 14a over the metallization layer 16a has the benefit of reducing the surface reflectivity of the metallization layer 16a that would otherwise affect the definition of the pattern transfer in the subsequent photolithograpliic process.

Moreover, it can help prevent the undesired occurrence of dielectric cracks and interconnect bridges in the dielectric layer 12 due to the occurrence of hillocks in the upward direction. Such hillocks result from stress caused by the expansion of the metallization layer 16a when the structure is subjected to heat treatment in the subsequent processes.

One drawback to the foregoing metal-line structure, however, is that the sidewalls thereof are in direct contact with dielectric, which would easily cause the occurrence of extrusions along the sidewalls of the metal lines 32 after the wafer has been subjected to a series of heat-treatment processes, such as the heat treatments used for the deposition of the dielectric layer, the forming of an alloy metallization layer, and the forming of the passivation layer.

In a high integration IC device, the forming of these extrusions easily causes cracks to occur in the dielectric layer between two neighboring metal lines, thus resulting in an undesired bridging effect (i.e., a short-circuit effect) between two neighboring metal lines. The resultant IC device may thus be unreliable in operation.

SUMMARY OF THE INVENTION

It is therefore an objective of the present invention to provide a metal-line structure and a method of fabricating the same in an IC device, which can help prevent the occurrence of extrusions along the sidewalls of the metal lines, thus allowing the resultant IC device to be more reliable in operation.

It is another objective of the present invention to provide a metal-line structure and a method of fabricating the same in an IC device, which can help reduce the manufacturing cost of the IC device.

In accordance with the foregoing and other objectives of the present invention, an improved metal-line structure and a method of fabricating the same are provided.

The metal-line structure of the invention includes a barrier layer, a metallization layer, an ARC (anti-reflective coating) and a spacer structure.

The method of the invention for fabricating a metal-line structure includes the following steps. A barrier layer is formed over the dielectric layer. A metallization layer is formed over the barrier layer. An ARC is formed over the metallization layer. Selected portions of the barrier layer, the metallization layer, and the ARC are removed to form a plurality of metal lines. A spacer structure is formed over all the exposed sidewalls of each of the metal lines.

It is a characteristic part of the invention that the forming of the blanket layer can help prevent the occurrence of extrusions along the sidewalls of the metal lines after the wafer has been subjected to a series of heat-treatment processes. As a result, the undesired formation of dielectric cracks and bridging between neighboring metal lines can be prevented.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The invention provides an improved metal-line structure and a method of fabricating the same, which is characterized by forming a spacer structure on the sidewalls of the respective metal lines in the metal-line structure. The spacer structure can help prevent the occurrence of extrusions along the sidewalls of the metal lines after the wafer has been subjected to a series of heat-treatment processes, so that the undesired formation of dielectric cracks and bridging between neighboring metal lines in the prior art can be prevented.

A preferred embodiment of the invention is disclosed in full details in the following with reference to FIGS. 2A–2F.

Figure 1A:
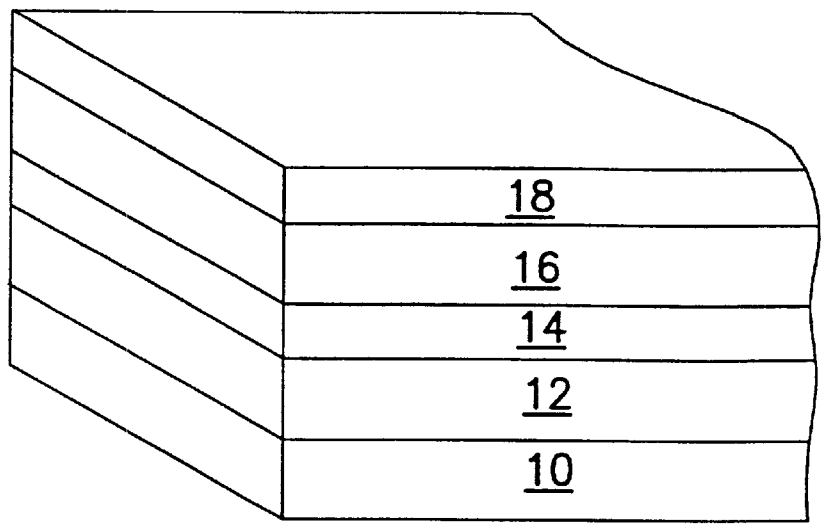
FIGS. 1A–1D are schematic sectional diagrams used to depict the steps involved in a conventional method for fabricating a metal-line structure on a semiconductor substrate.
Figure 1B:
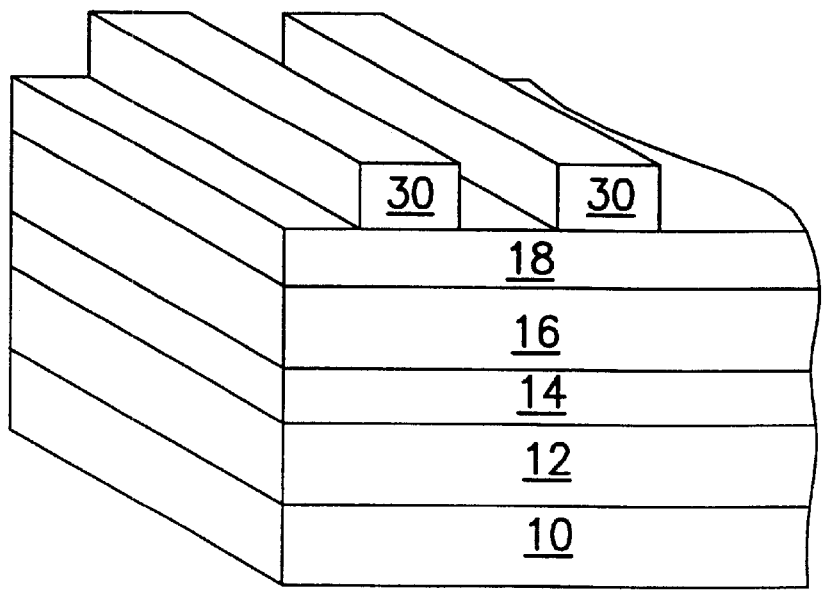
Figure 1C:
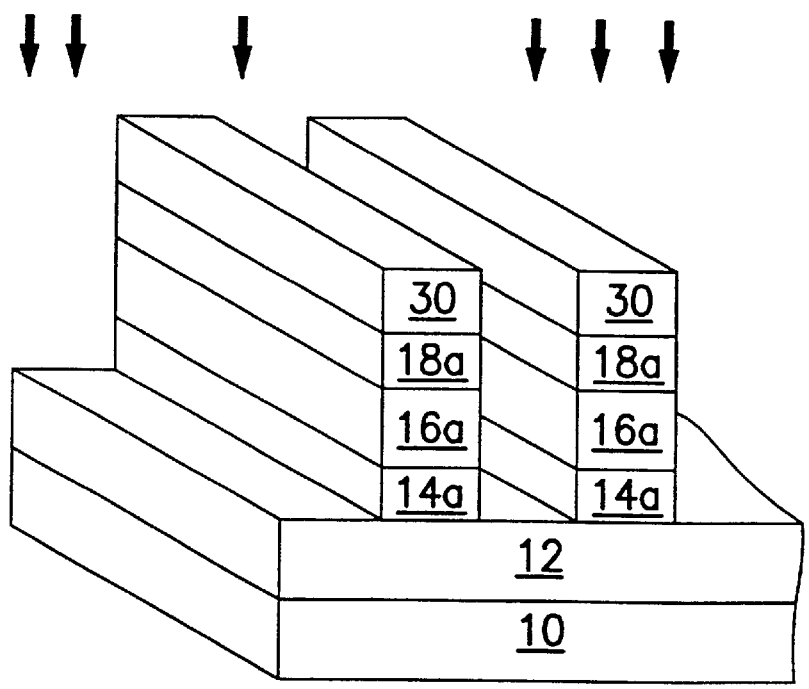
Figure 1D:
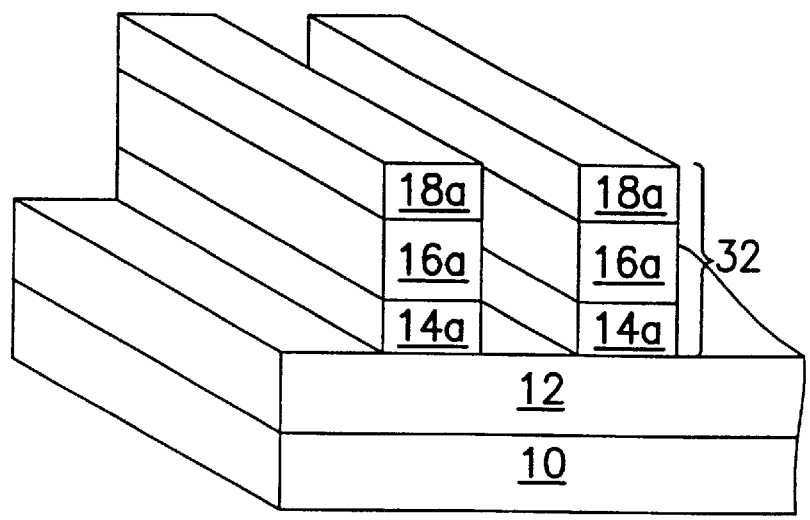
Figure 2A:
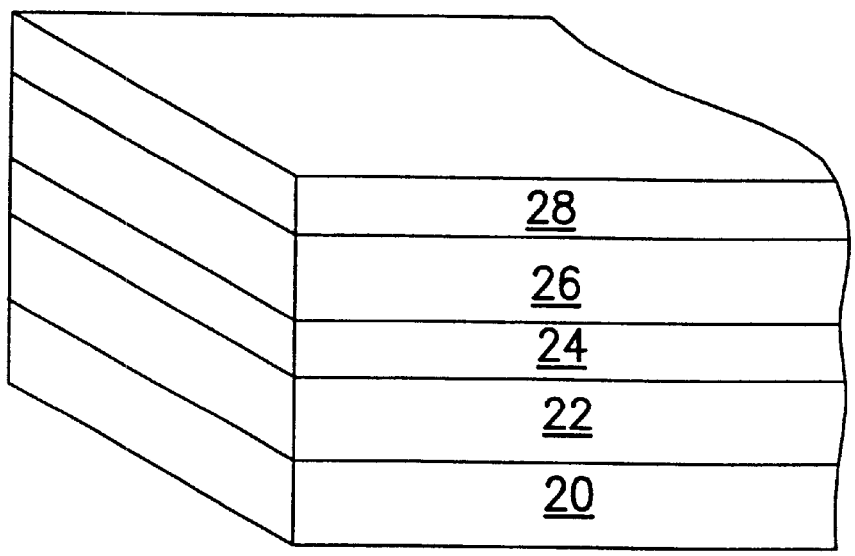
FIGS. 2A–2F are schematic sectional diagrams used to depict the steps involved in the method of the invention for fabricating a metal-line structure on a semiconductor substrate.

FIG. 2A shows the metal-line structure of the invention. The metal-line structure is constructed on a semiconductor substrate 20, which is already formed with a plurality of MOS transistors (not shown) thereon. Next, a dielectric layer 22 is formed over the substrate 20, preferably from silicon oxide or borophosphosilicate glass (BPSG) through a CVD (chemical-vapor deposition) process.

After this, a barrier layer 24 is formed over the dielectric layer 22 prior to the forming of a metallization layer 26. This barrier layer 24 can be formed from titanium nitride (TiN), titanium (Ti), tungsten nitride (WN), or the alloy of titanium and tungsten (Ti/W), and which serves to prevent the occurrence of spiking between the metallization layer 26 and the substrate 20. The metallization layer 26 is preferably formed from aluminum through a sputtering process.

Since the metallization layer 26 has high reflectivity to light, which can adversely affect the pattern transfer in the subsequent photolithographic process, an ARC (anti-reflective coating) 28 is coated over the entire top surface of the metallization layer 26 to eliminate this problem. The ARC 28 can be formed from any non-reflective material, such as titanium nitride (TiN), titanium (Ti), tungsten nitride (WN), or the alloy of titanium and tungsten (Ti/W). However, the ARC 28 is preferably made from the same material used to form the barrier layer 24 so that the process can be carried out in a more cost-effective way.

Figure 2B:
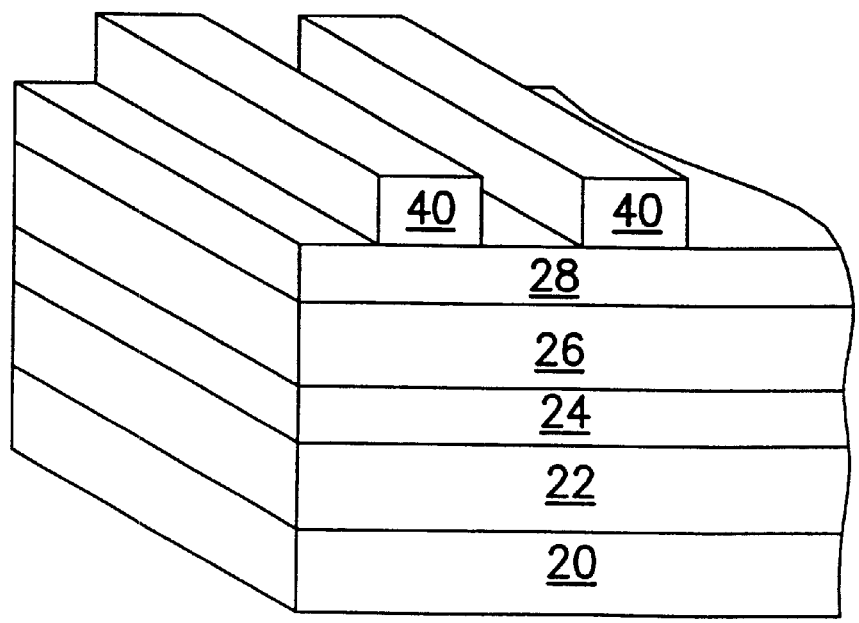

FIG. 2B shows formation of a plurality of photoresist layers 40 at selected locations over the wafer through a photolithographic and etching process. More specifically, these photoresist layers 40 are defined and formed at those locations where a plurality of horizontally extending metal lines for the IC device are to be formed.

Figure 2C:
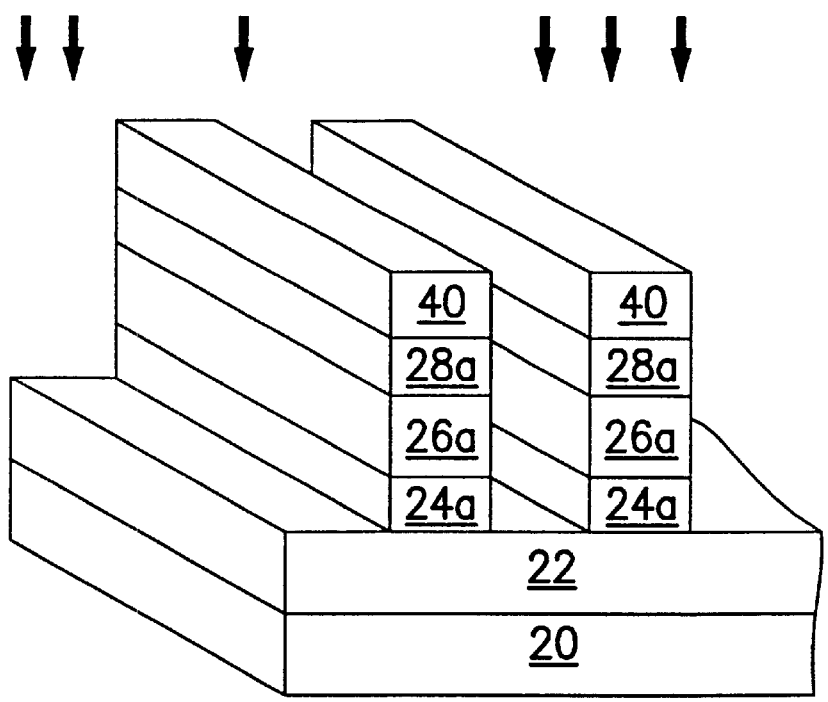

FIG. 2C shows the subsequent step, in which an anisotropic dry etching process is performed, with the photoresist layers 40 serving as mask, on the wafer until the top surface of the dielectric layer 22 is exposed. Through this process those parts of the ARC 28, the metallization layer 26, and the barrier layer 24 that are uncovered by the photoresist layers 40 are entirely removed (the remaining parts thereof are herein and hereinafter designated instead by the reference numerals 28a, 26a, 24a for distinguishing purposes).

Figure 2D:
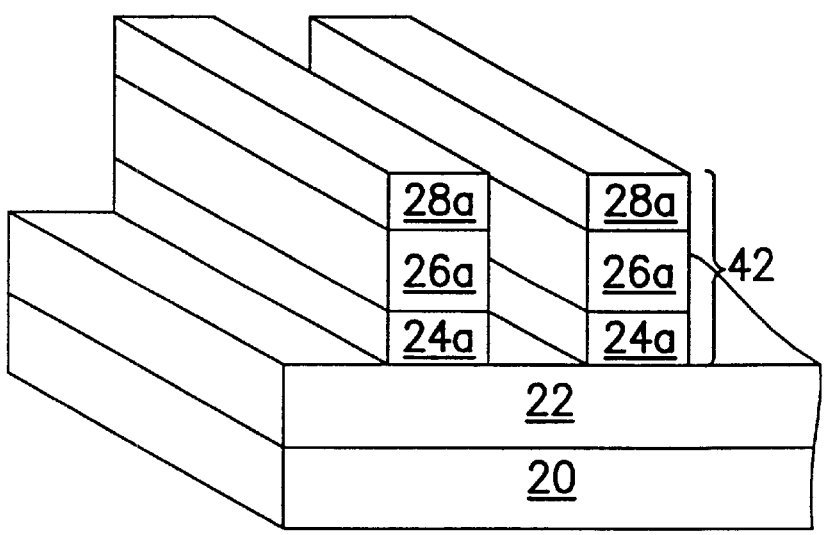

FIG. 2D shows the subsequent step, in which the photoresist layers 40 are entirely removed. After this, each metallization layer 26a, the underlying barrier layer 24a, and the overlying ARC 28a in combination constitute one metal line (as collectively designated by the reference numeral 42). In the case of FIG. 2D, for example, two metal lines are illustrated for demonstrative purposes. Up to this stage, the metal-line structure is substantially identical in structure and method as the prior art of FIGS. 1A–1D.

Figure 2E:
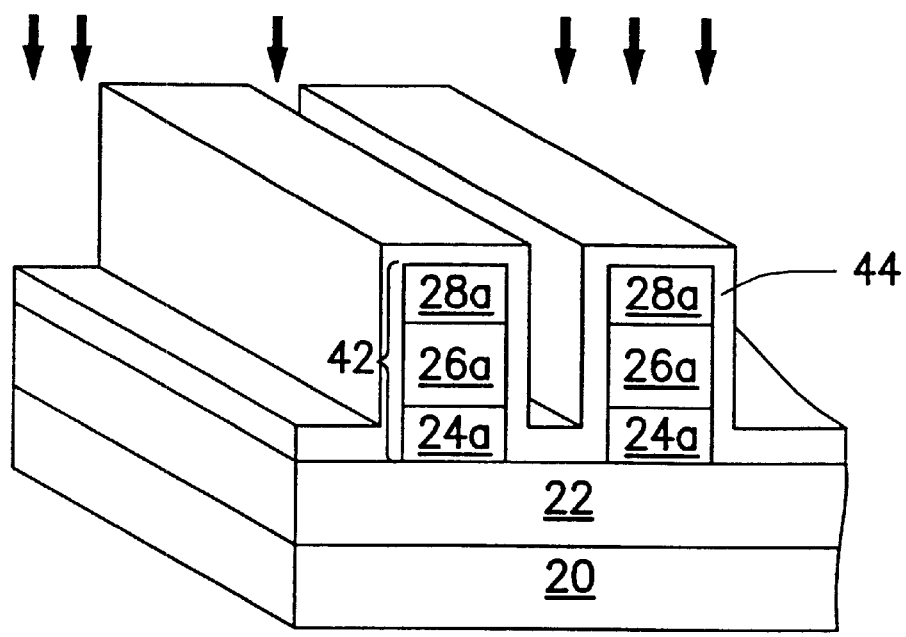

FIG. 2E illustrates the subsequent step, in which a blanket layer 44 is formed over the entire exposed surfaces of the metal lines 42 and the dielectric layer 22. The blanket layer 44 can be formed from the same material used to form the ARC 28, such as titanium nitride (TiN), titanium (Ti), tungsten nitride (WN), or the alloy of titanium and tungsten (Ti/W), through a sputtering process.

Figure 2F:
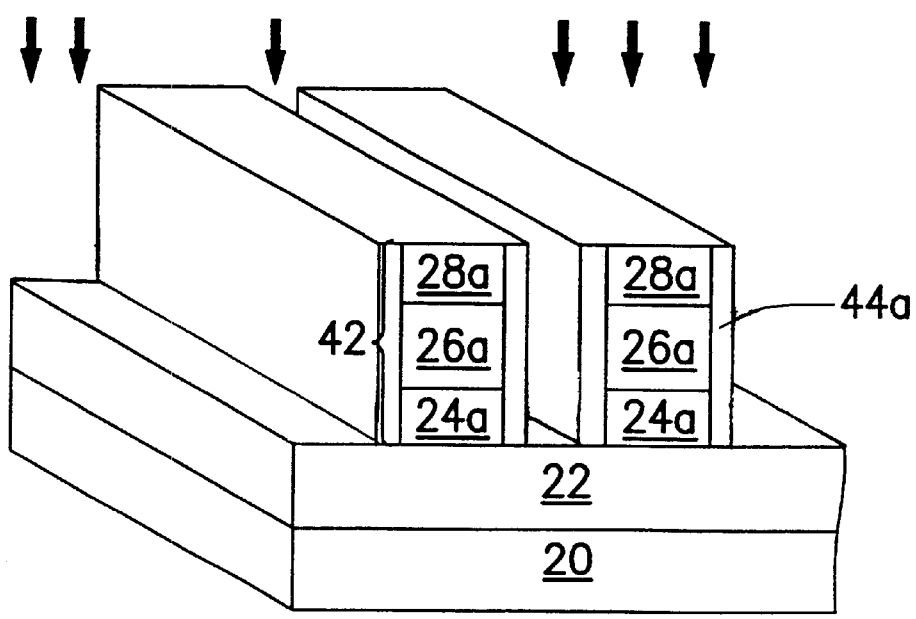

FIG. 2F shows the final step, in which an anisotropic etching process is performed on the blanket layer 44 until those portions of the blanket layer 44 that are layered directly over the top surface of the metal lines 42 are entirely removed, with the remaining portions still covering the sidewalls of each of the metal lines 42 to serve as a spacer structure 44a. This completes the fabrication of the metal-line structure in accordance with the invention.

It is a characteristic part of the invention that the forming of the spacer structure 44a can help prevent the occurrence of extrusions along the sidewalls of the metal lines 42 after the wafer has been subjected to a series of heat-treatment processes. As a result, the undesired forming of dielectric crack and bridging between neighboring metal lines can be prevented. The invention is therefore more advantageous than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A metal-line structure constructed on a dielectric layer over a semiconductor substrate, which structure comprises:

a barrier layer formed at a selected location over the dielectric layer;

a metallization layer formed over the barrier layer;

an ARC formed over the metallization layer; and a spacer structure formed over all the exposed sidewalls of the barrier layer, the metallization layer and the ARC, without covering a top surface of the ARC, wherein the barrier layer, the ARC and the spacer structure are made of a same material.

2. The metal-line structure of claim 1, wherein the dielectric layer is formed from a dielectric material selected from a group consisting of silicon dioxide and BPSG.

3. The metal-line structure of claim 1, wherein the barrier layer is formed from a material selected from a group consisting of titanium nitride, titanium, tungsten nitride, and the alloy of titanium and tungsten.

4. The metal-line structure of claim 1, wherein the metallization layer is formed from aluminum.

5. The metal-line structure of claim 1, wherein the ARC is formed from a material selected from the group consisting of titanium nitride, titanium, tungsten nitride, and the alloy of titanium and tungsten.

6. The metal-line structure of claim 1, wherein the spacer structure is formed from a material selected from the group consisting of titanium nitride, titanium, tungsten nitride, and the alloy of titanium and tungsten.

* * * * *